US006489083B1

(12) United States Patent
Smith et al.

(10) Patent No.: US 6,489,083 B1
(45) Date of Patent: Dec. 3, 2002

(54) SELECTIVE SIZING OF FEATURES TO COMPENSATE FOR RESIST THICKNESS VARIATIONS IN SEMICONDUCTOR DEVICES

(75) Inventors: Bradley P. Smith, Austin, TX (US);
Edward O. Travis, Austin, TX (US);
Sejal N. Chheda, Austin, TX (US);
Ruiqi Tian, Pflugerville, TX (US)

(73) Assignee: Motorola, Inc., Schaumburg, IL (US)

( * ) Notice: Subject to any disclaimer, the term of this patent is extended or adjusted under 35 U.S.C. 154(b) by 120 days.

(21) Appl. No.: 09/677,496

(22) Filed: Oct. 2, 2000

(51) Int. Cl.$^7$ .................................................. G03F 7/00
(52) U.S. Cl. ....................... 430/313; 430/311; 430/314; 430/322; 430/323; 430/324
(58) Field of Search ................................ 430/311, 313, 430/314, 322, 323, 324

(56) References Cited

U.S. PATENT DOCUMENTS 5,789,300 A * 8/1998 Fulford, Jr. .................. 438/301
5,804,498 A * 9/1998 Jang et al. ................... 438/624

OTHER PUBLICATIONS

George Y. Liu et al., "Chip–Level CMP Modeling And Smart Dummy For HDP And Conformal CVD Films", Proceedings of CMP–MIC Feb. 11, 1999, (8 pages).

* cited by examiner

Primary Examiner—Mark F. Huff
Assistant Examiner—Nicole Barreca

(57) ABSTRACT

A process for forming a masking database that includes defining a first feature level for the masking database corresponding to a first layer. The first feature level includes a first region with a first feature density and a second region with a second feature density that is substantially different from the first feature density. The process also includes defining a second feature level for the masking database corresponding to a second layer, wherein the second feature level is to be formed over a substrate after the first feature level has been formed over or within the substrate. A first feature within the second feature level will be formed within the first region, a second feature within the second feature level will be formed within the second region. The second layer will have a first thickness over the first layer within the first region and has a second thickness over the first layer within the second region. At least one of the first and second features is adjusted to at least partially compensate for a difference between the first and second thicknesses.

21 Claims, 5 Drawing Sheets

SELECTIVE SIZING OF FEATURES TO COMPENSATE FOR RESIST THICKNESS VARIATIONS IN SEMICONDUCTOR DEVICES

RELATED APPLICATION

This application is related to U.S. patent application Ser. No. 09/340,697 filed Jun. 29, 1999 now U.S. Pat. No. 6,376,158, and entitled "Semiconductor Device and a Process for Designing a Mask"; and U.S. patent application Ser. No. 09/470,873 filed Dec. 22, 1999 now U.S. Pat. No. 6,459,156, and entitled "Semiconductor Device, a Process for a Semiconductor Device, and a Process for Making a Masking Database," which are incorporated herein by reference and assigned to the current assignee hereof.

FIELD OF THE INVENTION

The present invention relates to semiconductor devices, masks, and processes for forming or designing them and, more particularly, to selective sizing of features to compensate for resist thickness variations.

RELATED ART

In the semiconductor manufacture process, the various process steps and their sequence can yield non-planar topographical features of the semiconductor device. The topographical features are necessary in order to provide desired function in the device. The topographical variation caused by the features, however, can present certain problems in the semiconductor manufacturing process and also in operations of the final product semiconductor device.

These problems are particularly encountered in via locations of the device during manufacturing. For example, the exposure energy and procedures to print vias must account for the greatest thicknesses of resist although resist thickness varies. By doing so, overetching or underetching of portions on the same die can occur. This is due to the thicker resist decreasing the etch rates as the aspect ratio of the vias increase. As used herein, aspect ratio of an opening is a ratio of the depth of the opening to the width of the opening.

Resist thickess variations result in via size variations, even within the same die. Thus, a single via exposure produces vias with a range of sizes. This lack of size control can be problematic during manufacturing.

Another problem includes "side lobing" when a phase-shifting mask is used. When radiation passes through a phase-shifting mask, a secondary peak in radiation occurs near the edge of the feature being printed in the resist. The resist requires higher levels of radiation to expose the resist at locations where the resist is thicker. However, if the radiation is too high, the secondary peak can exceed the level of energy needed to expose a pattern in the resist. Because these typically occur near the edge of a pattern, it is called "side lobing." If the minimum exposure required for the thicker resist exceeds the maximum exposure before side lobing occurs, undesirable features may be printed.

The problems described above are particularly apparent in trench first, via last (TFVL) manufacturing procedures, which is a process for forming dual-inlaid openings for interconnects or the like, where trenches are formed before via openings. An example of the resist thickness variation is shown in FIG. 1.

FIG. 1 includes an illustration of a cross-sectional view of a prior art semiconductor system 100. The system 100 includes a semiconductor device workpiece 101 having a substrate or insulating layer (a first layer, such as an oxide layer) 102 with trenches 103 and 105. The semiconductor device workpiece 101 includes a second (or resist) layer 104 such as a photoresist layer. The second layer 104 includes openings 106 and 108 to correspond to certain features of the semiconductor device substrate 102. A mask 110 is also included in the system 100 and includes an attenuator (such as a chrome layer) 112 and a substrate (such as glass) 114. The mask 10 also includes openings 116 and 118.

The semiconductor device workpiece 101 is conventional in that it includes a semiconductor device substrate (not shown in full at 102), such as a monocrystalline semiconductor wafer, a semiconductor-on-insulator substrate, or any other substrate suitable for use to form semiconductor devices. As those skilled in the art know and appreciate, the semiconductor device substrate can comprise various layers and configurations, including active, passive, insulative, conductive and other elements, as desired in the particular case.

The resist or second layer 104 is formed over the substrate or insulating layer 102 and within the trenches 103 and 105. Due to the shapes and locations of the trenches, viscosity of the resist layer 104 (when coated), and other fluid mechanical properties, the resist layer 104 is not planar at its uppermost surface and has different thicknesses in the wide trench 105 and the narrow trench 103. The resist layer 104 is patterned to correspond to via locations, which are locations where vias will be formed. With increased trench width, the resist thickness in the trench decreases. For example, the thickness A of the resist 104 in the narrow trench 103 is greater than the thickness B of the resist 104 in the wide trench 105.

Openings 106 and 108 are formed within the resist layer 104 to correspond to the via locations. Before forming openings 106 and 108, the resist layer 104 is significantly thicker where resist opening 106 (e.g. approximately 2.5 microns) will be formed compared to where the resist opening 108 (e.g., approximately 1.7 microns) will be formed. In some technologies, the energy of radiation required to expose the resist layer 104 in forming the opening 106 exceeds the maximum energy before side lobing which will be seen when a phase-shift mask is used.

The resist openings 106 and 108 may have significantly different sizes because of the corresponding differences in resist thicknesses. When the pattern is etched into insulating layer 102, the resulting etched pattern will also have varying sizes, some being larger than desired, some being smaller than desired.

In addition, the different sizes of resist openings 106 and 108 can cause variations in etch rate because of the differences in aspect ratio. The insulating layer 102 will etch more quickly under resist opening 108 because the aspect ratio of resist opening 108 is smaller than the aspect ratio of resist opening 106. The lower aspect ratio allows etchant and etch products to enter and leave the resist opening 108 more easily compared to resist opening 106. The result is that a different amount of time is needed to remove the insulating layer 102 under resist openings 106 and 108.

FIG. 2 is a graphical representation 200 illustrating a size of a feature or dimension in insulating layer 102 as a function of the thickness of the resist in which it is printed. A dashed line 202 represents the bulk effect and is a function of the resist properties. A solid line 204 represents a swing effect variation in feature size and is a function of substrate reflectivity. This curve is generally true for any resist system, but the magnitudes of the linear and sinusoidal components will vary with resist and substrate properties.

Many other problems and disadvantages of the prior art will become apparent to one skilled in the art after comparing such prior art with embodiments of the present invention as described herein.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As used herein unless otherwise stated, the terms "dense" and "density" refer to the feature (e.g., wiring structures, plugs, gate electrodes, and other active and passive elements) density of a specific area of a semiconductor device or workpiece. For example, a more dense area of a semiconductor device will have a larger portion of the area occupied by feature(s) located in the particular area (such as, for example, wiring structures, vias, and so forth) than a less dense area of the device (such as, for example, a trench around which there are no wiring structures or vias).

Figure 1:
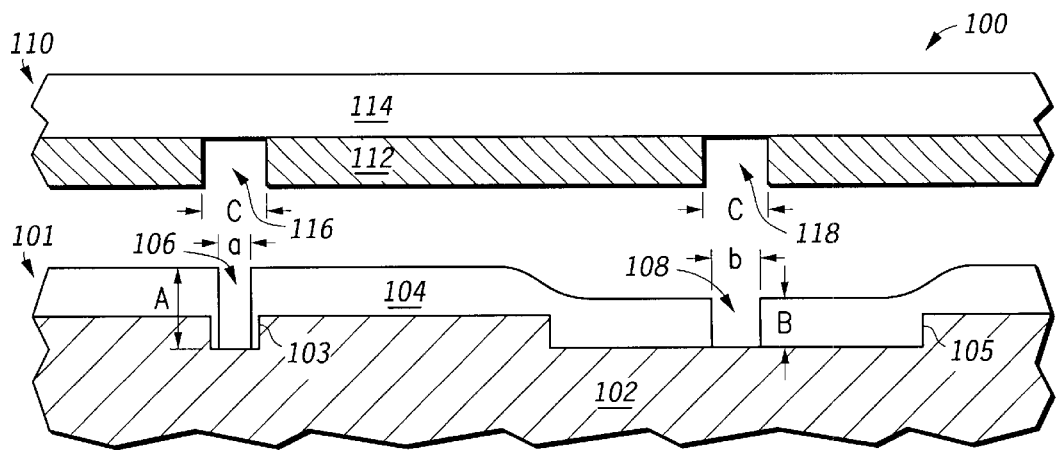
FIG. 1 includes an illustration of a cross-sectional view of a prior art semiconductor device substrate having an interlevel dielectric (ILD) layer with trenches, and a resist layer formed on the ILD layer and within the trenches.
Figure 2:
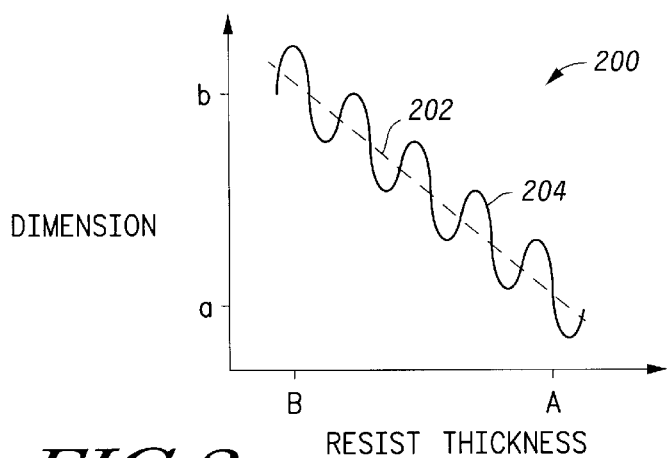
FIG. 2 is a graphical representation illustrating the size of a feature as a function of the thickness of the resist in which it is printed.
Figure 3:
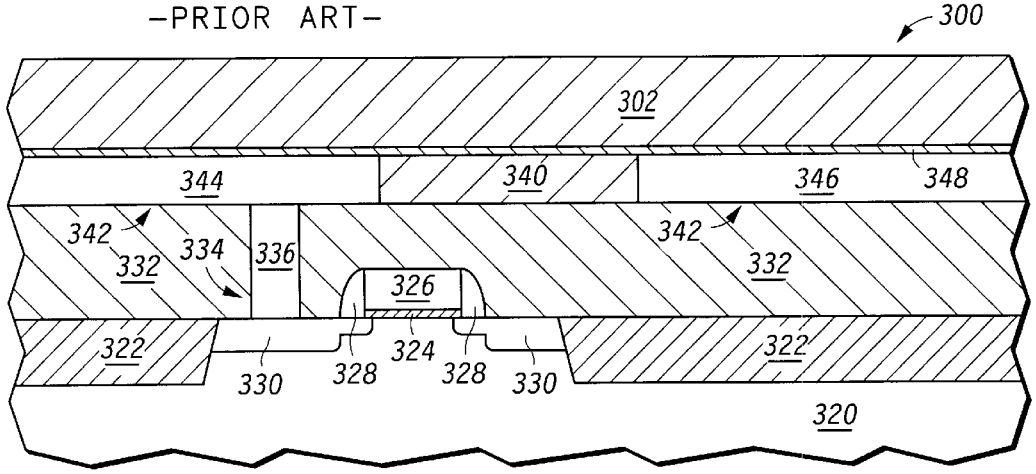
FIG. 3 includes an illustration of a cross-sectional view of a portion of a semiconductor device formed in accordance with an embodiment of the present invention.

FIG. 3 includes an illustration of a cross-sectional view of a portion of a semiconductor device 300 formed in accordance with an embodiment of the present invention. The semiconductor device 300 includes an illustration of a portion of a semiconductor device workpiece 320, which can include a monocrystalline semiconductor substrate, a semiconductor-on-insulator substrate, or any other substrate used for forming semiconductor devices. Field isolation regions 322 and doped regions 330 are formed within or from portions of the workpiece 320. The doped regions are source, drain, or source/drain regions (current carrying electrodes). A gate dielectric layer 324 and a gate electrode (control electrode) 326 overlie portions of the doped regions 330 and a portion of the workpiece 320 lying between the doped regions 330. Sidewall spacers 328 are formed along sides of the gate dielectric layer 324 and gate electrode 326.

A first interlevel dielectric (ILD) layer 332 is formed over the workpiece 320 and gate structure for the transistor illustrated. The first ILD layer is patterned to form an opening 334 that includes a conductive plug 336. A second insulating layer 340 is formed and patterned to include interconnect trenches 342. A conductive layer is deposited over the insulating layer 340 and within the trenches 342. A planarization act, such as chemical mechanical polishing (CMP), is performed to remove portions of the conductive layer lying outside the trenches 342 to form the interconnects 344 and 346 as shown in FIG. 3. The interconnects 344 and 346 make electrical connections to other portions (not shown) of the semiconductor device. An etch stop or capping layer 348 is formed over the interconnects 344 and 346. A second ILD layer 302 is formed over the etch stop layer 348.

The first ILD layer 332, insulating layer 340, and second ILD layer 302 typically include at least one film of an oxide, nitride, oxynitride, or low-k material. As used herein, a low-k or low dielectric constant material is a material with a dielectric constant no greater than approximately 4.1. The etch-stop or capping layer 348 typically includes a material different from the second ILD layer 302 to allow endpoint detection or a copper diffusion block of a process used when etching through the second ILD layer 302. The conductive plug 336 and interconnects 344 and 346 include mostly doped silicon, tungsten, aluminum, copper, titanium, titanium nitride, titanium tungsten or the like. As used herein, mostly means at least half. Therefore, at least half of the conductive plug 336, and interconnects 344 and 346 are one of the materials previously listed. Typically, conductive plug 336 and interconnects 344 and 346 include an adhesion or barrier film. Layer 348 can be a capping layer to reduce the likelihood that copper within interconnects 344 and 346 will migrate into the workpiece 320. The process to form the semiconductor device to this point in the process is conventional.

Figure 4:
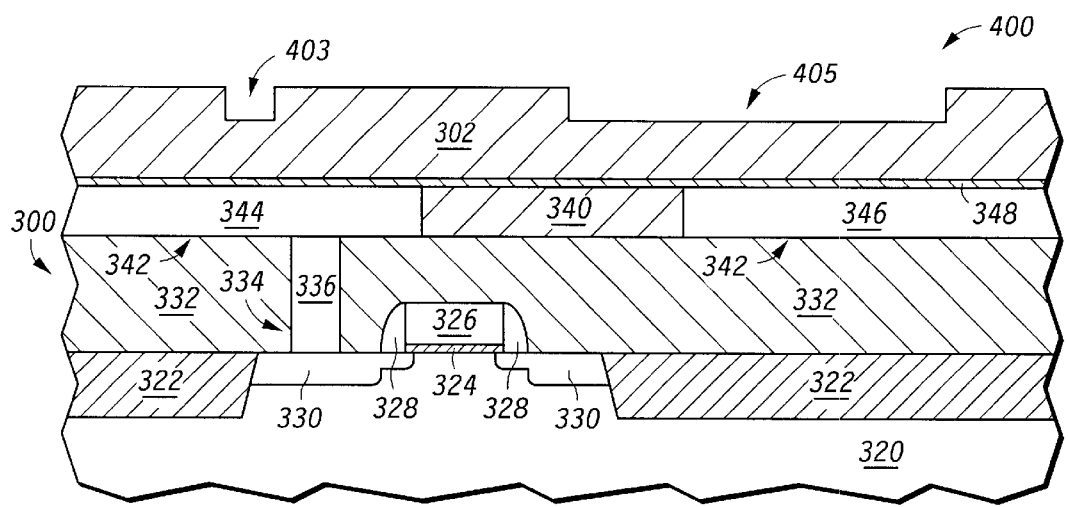
FIG. 4 illustrates a cross-sectional view of a portion of the semiconductor device of FIG. 3 formed in accordance with an embodiment of the present invention wherein interconnect trenches are formed.

FIG. 4 illustrates a cross-sectional view of the portion of the semiconductor device 300 formed in accordance with an embodiment of the present invention. The portion of the semiconductor device 300 with modifications is referred to herein as semiconductor device 400. The second ILD layer 302 is patterned in conventional manner and includes trenches 403 and 405. The trench 403 is less dense feature while the trench 405 is a large feature. The trenches 403 and 405 correspond to regions where interconnect portions of wiring structures will be formed. In a non-limiting example, trench 403 has a width of approximately 0.8 microns, and trench 405 has a width of at least 5.0 microns. Clearly, the width of the trenches 403 and 405 can be wider or narrower. For example, the width of trench 403 can be narrower than approximately 0.3 microns, and the width of the trench 405 can be wider than approximately 11.0 microns.

An optional adhesion layer (not shown) and a lithographic resist layer (504), which is typically coated as a flowable film, may be formed atop the second ILD layer 302 and within trenches 403 and 405

Figure 5:
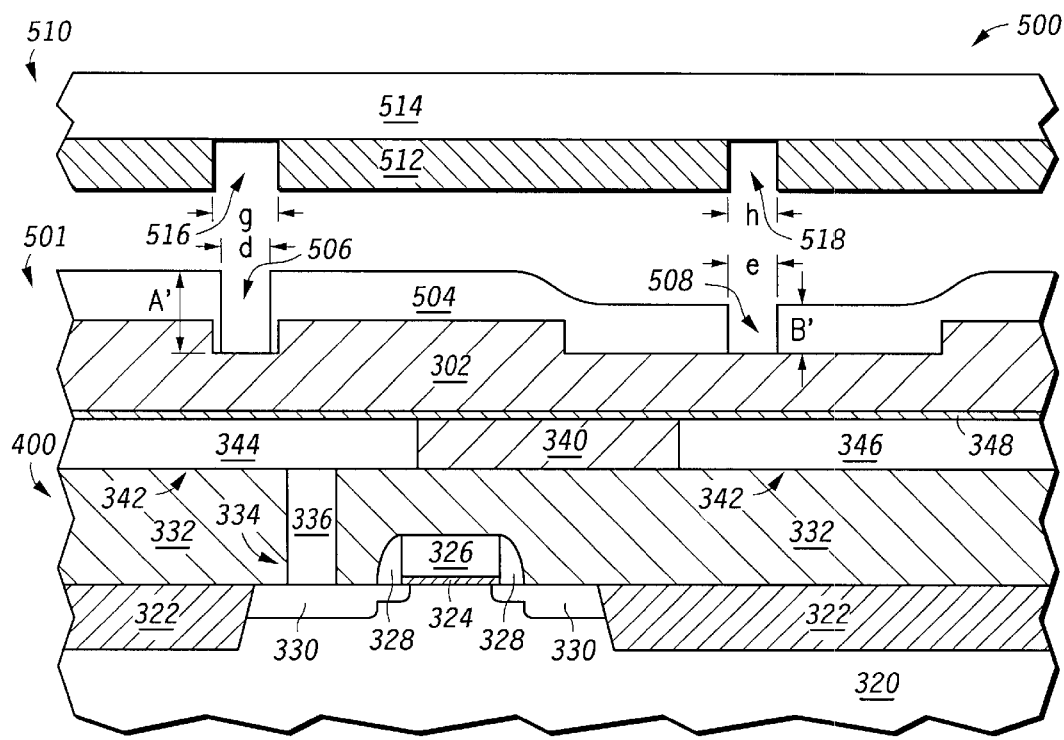
FIG. 5 is a cross-sectional view of a system having a semiconductor device substrate and a mask wherein features printed in resist correspond to features in the mask.

FIG. 5 is a cross-sectional view of a system 500 having a semiconductor device substrate 501 and a mask 510. The semiconductor device substrate 501 includes the semiconductor device 400 with modifications. In the illustrated embodiment, the second ILD layer 302 is oxide and a resist layer 504 is photoresist or a low-k material. The mask 510 includes a substrate 514 which may be a glass material and an attenuator 512 that further includes at least two openings 516 and 518. The openings 516 and 518 are adjusted according to an embodiment of the present invention. For example, the photoresist thickness in the opening 506 having a width "d" may have the thickness as indicated by the letter A'. The resist thickness in the opening 508 having a width "e" is thinner as indicated by the letter B'. For example, in one embodiment, the resist thickness A' is at least 10 percent thicker than the resist thickness B'. According to an embodiment of the present invention, the feature sizes of the openings 516 and 518 can be determined utilizing a model correlating the resist thickness and the desired feature size dimensions. For example, for the feature sized "g" for the opening 516 the photoresist thickness is A'. According to an embodiment of the present invention the dimension "g" of the opening 516 may be larger than the dimension "d" of the opening 506. Similarly, to obtain the dimension "e" of the opening 508, a smaller dimension "h" of the opening 518 may be used.

In one embodiment, a process for forming a semiconductor device includes forming a patterned first layer over a semiconductor device substrate, wherein the patterned first layer includes a first feature within a first region having a first feature density, and a second feature within a second region having a second feature density that is substantially different from the first feature density. In addition, a second layer is formed over the patterned first layer, and patterned using a mask to form a third feature and a fourth feature. The mask includes a fifth feature corresponding to the third feature and a sixth feature corresponding to the fourth feature. A first ratio is a ratio of a lateral dimension of the third feature compared to a lateral dimension of the fourth feature, a second ratio is a ratio of a lateral dimension of the fifth feature compared to a lateral dimension of the sixth feature. The first ratio is different compared to the second ratio.

In one embodiment, forming the second layer is performed by coating the second layer over the semiconductor device substrate. The second layer may be a resist layer or include a lock dielectric material. In one embodiment, the first and second feature densities correspond to trench densities within the first layer. In one embodiment, the first thickness of the second layer within the first region is at least approximately 10 percent thicker than a second thickness of the second layer within the second region. In this embodiment, the third feature may correspond to the first feature, the fourth feature may correspond to the second feature, the third and fourth features may occupy a substantially same amount of area within the second layer, and an area of the fifth feature may be larger than an area of the sixth feature. The first layer may be characterized by a step height, and a lesser of the first and second thicknesses may be no thicker than approximately twice the step height.

In one embodiment, each of the first and second regions occupies an area of approximately 100 square microns. In one embodiment, the first ratio is approximately equal to one.

In another embodiment, a process for forming a semiconductor device includes providing a substrate including a first feature and a second feature, forming a first layer over the (semiconductor device) substrate, wherein the first layer has an undulating, exposed surface, the first layer has a first thickness over the first feature, the first layer has a second thickness over the second feature, and the second thickness is different from the first thickness. In addition, the process includes patterning the first layer using a mask to form a third feature and a fourth feature within the first layer. The mask includes a fifth feature corresponding to the third feature, and a sixth feature corresponding to the fourth feature. A first ratio is a ratio of a lateral dimension of the third feature compared to a lateral dimension of the fourth feature, a second ratio is a ratio of a lateral dimension of the fifth feature compared to a lateral dimension of the sixth feature, and the first ratio is substantially different compared to the second ratio.

In one embodiment, the first layer is performed by coating the first layer over the substrate. In one embodiment, the first layer is a resist layer or includes a low-k dielectric material. In one embodiment, the first thickness is at least approximately 10 percent thicker than the second thickness.

In one embodiment, the third feature lies within a first region having a first feature density, the fourth feature lies within a second region having a second feature density, and the second feature density is larger than the first feature density. In this embodiment, the process may further include forming a seventh feature and an eighth feature within the substrate, wherein the seventh feature may be formed below the third feature, the eighth feature may be formed below the fourth feature, and the seventh feature and the eighth feature may occupy substantially a same amount of area. The first and second feature densities may correspond to trench densities within the first layer. Each of the first and second regions may occupy an area of approximately 100 square microns.

In one embodiment, the first thickness is at least approximately 10 percent thicker than the second thickness. In one embodiment, the first ratio is approximately equal to one.

Data related to forming masks, such as mask 510, may be kept in a masking database. The masking database may define many feature levels where each feature level generally corresponds to a layer of a semiconductor device. For example, mask 510 corresponds to a feature level having features 516 and 518. Features 516 and 518 correspond to features 506 and 508, respectively, of resist layer 504. Therefore, by defining a plurality of feature levels, a masking database may be formed for use in manufacturing masks, which in turn may be used to manufacture semiconductor devices or portions of semiconductor devices. Each feature level or semiconductor device layer may further be characterized by a step height. Generally, the lesser of resist thickness A' and B' is no thicker than twice the step height.

Figure 6:
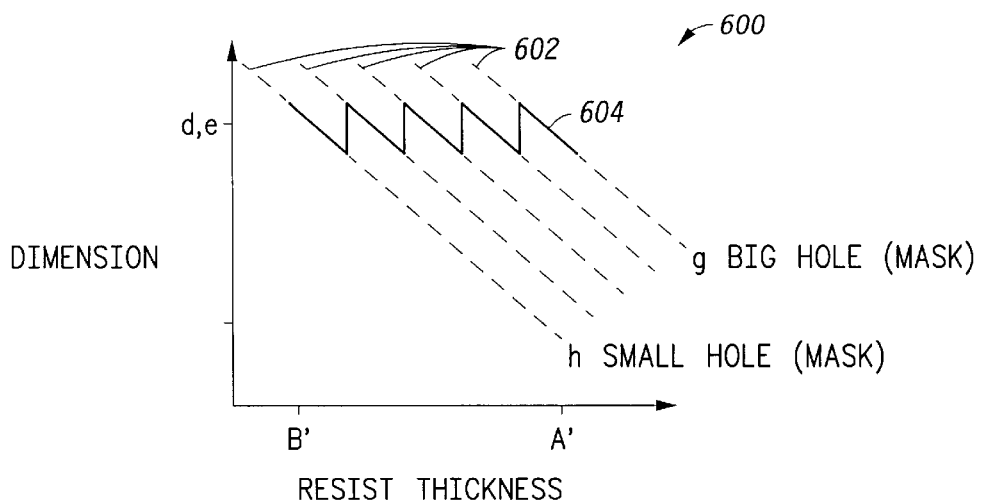
FIG. 6 is a graphical representation illustrating a dimension of a feature being printed for different a resist thickness and mask feature size.

FIG. 6 is a graphical representation 600 illustrating a dimension of a feature being printed as a function of a resist thickness and mask feature size. Dashed lines 602 represent the dimension feature size for a given mask feature dimension. For example, a preferred resist thickness could be 1.5–2.5 microns while the dimension feature size could be 0.5–0.6 microns. A sawtooth waveform 604 represents variations in the final feature dimension that can be controlled by selecting different mask feature sizes for different values of resist thickness. The sawtooth waveform 604 approaches a straight line for a large number of the dashed lines 602 that appear in the graphical representation 600.

Figure 7:
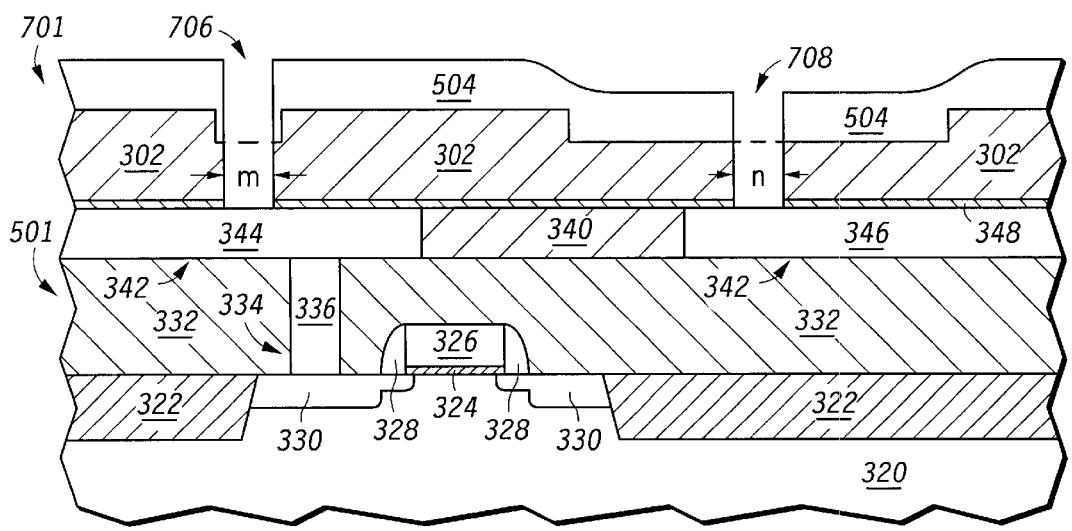
FIG. 7 illustrates a cross-sectional view of an exemplary semiconductor device substrate according to an embodiment of the present invention wherein features are illustrated having been etched into the underlying dielectric.

FIG. 7 illustrates a cross-sectional view of an exemplary semiconductor device substrate 701 according to an embodiment of the present invention. The semiconductor device substrate 701 includes the semiconductor device 501 with modifications and additions. The second ILD layer 302 is commonly oxide and the resist layer 504 is typically photoresist. Underlying the second ILD layer 302 is the etch stop layer 348. The openings 506 and 508 of FIG. 5 are further etched through the second ILD layer 302 and the etch stop layer 348, forming openings 706 and 708. In this embodiment the openings 706 and 708 include the dimensions "m" and "n". According to an embodiment of the present invention, the dimensions "m" and "n" are substantially the same as intended by the adjustments to the mask 510. Therefore, it can be appreciated how variations between the dimensions "g" and "h" of openings 516 and 518 of mask 510 produce openings within resist layer 504 with substantially the same dimensions, "m" and "m", even though the resist layer 504 varies in thickness.

Figure 8:
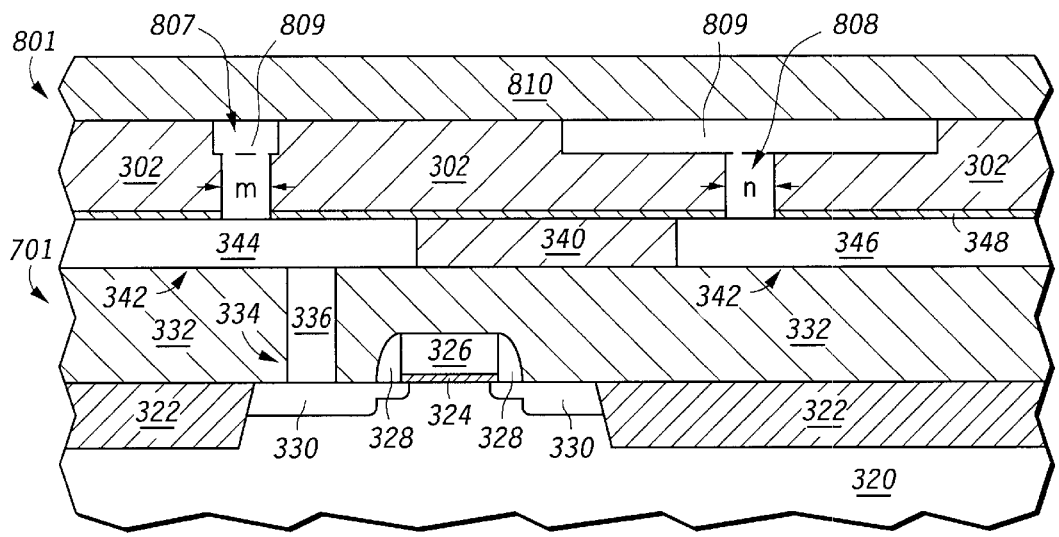
FIG. 8 illustrates a cross-sectional view of a semiconductor device substrate that includes the semiconductor device of FIG. 7 wherein dielectric is illustrated as having been deposited on top of the workpiece and having been processed with this invention.

FIG. 8 illustrates a cross-sectional view of a semiconductor device substrate 801 that includes the semiconductor device substrate 701. In this case, the resist layer 504 was removed and the openings 706 and 708 were filled with a conductive fill material 809 forming a dual inlaid via 807 and a dual inlaid via 808. As indicated by dashed lines, both the dual inlaid via 807 and the dual inlaid via 808 include interconnect portions (also referred to as trench portions) where the interconnect portion of the dual inlaid via 808 is much wider than the interconnect portion of the dual inlaid via 807. However, the via portions of dual inlaid vias 807 and 808 exhibit substantially the same dimensions (e.g. "m" vs. "n"). The conductive fill material 809 is polished back stopping on the surface of the second ILD layer 302. A passivation layer 810 is then deposited.

Figure 9:
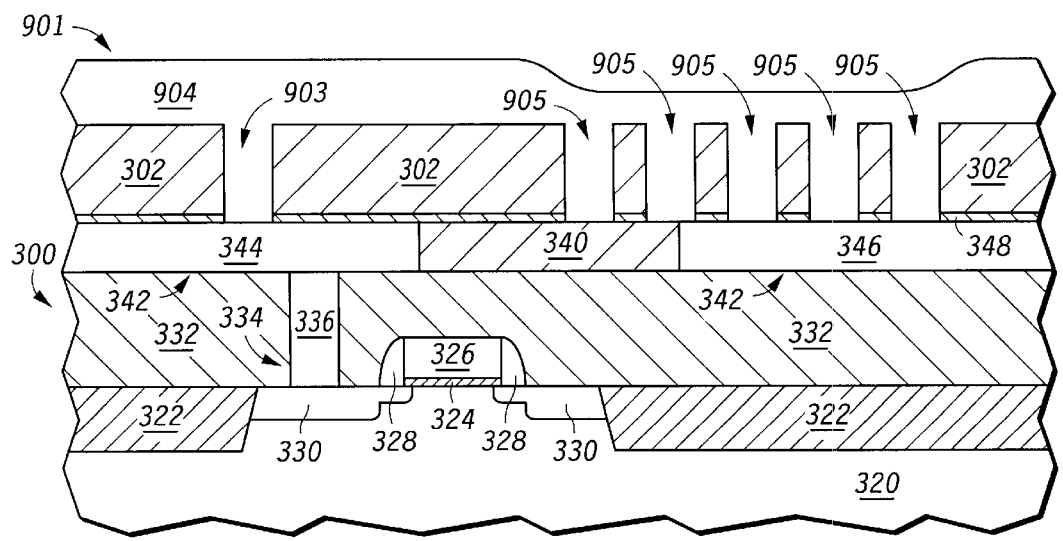
FIG. 9 illustrates a cross-sectional view of an exemplary semiconductor device substrate according to an embodiment of the present invention and illustrates resist having been spun over etched via features.

FIG. 9 illustrates a cross-sectional view of an exemplary semiconductor device substrate 901 according to an embodiment of the present invention. The semiconductor device substrate 901 includes the semiconductor device substrate 801 with modification and additions. The semiconductor device substrate 901 includes the second ILD layer 302 and the etch stop layer 348. For this particular embodiment, vias are formed in the second ILD layer 302 as illustrated by an opening 903 and a plurality of openings 905. The opening 903 indicates an isolated opening whereas the plurality of openings 905 indicates a dense concentration of openings. A resist layer 904 is then deposited upon the semiconductor device substrate 901. In this case, the resist thickness in the isolated opening 903 is greater than the resist thickness in the dense concentration of openings 905.

Figure 10:
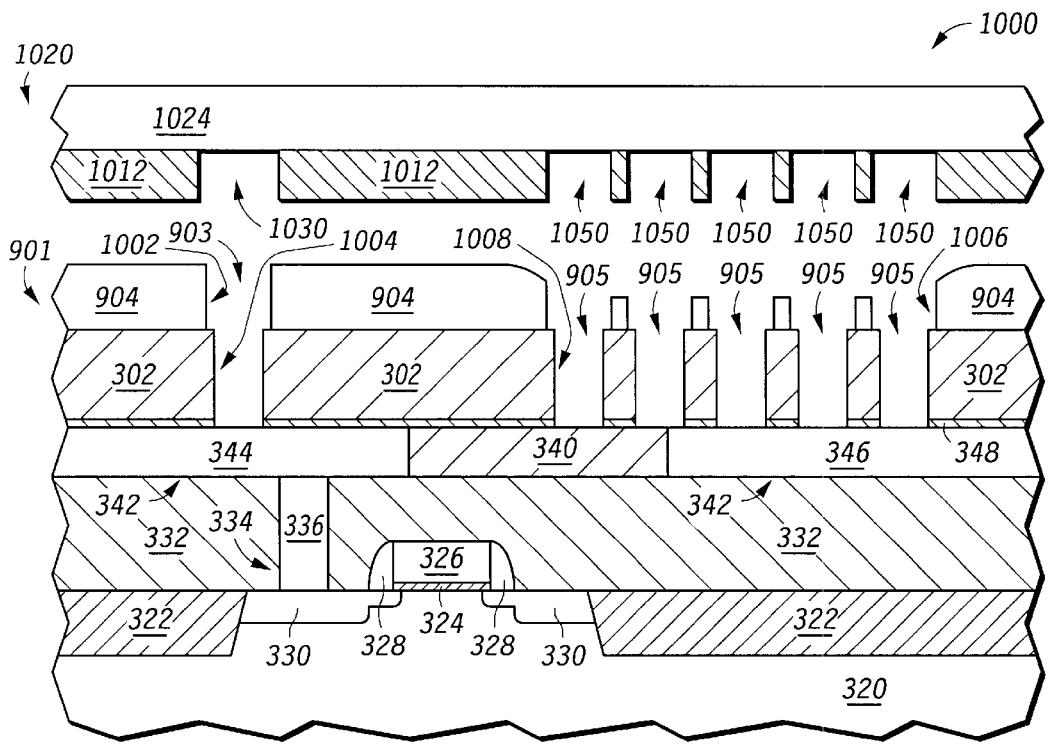
FIG. 10 illustrates a system having the semiconductor device substrate of FIG. 9 and a mask wherein features printed in resist correspond to features in the mask.

FIG. 10 illustrates a system 1000 having the semiconductor device substrate 901 and a mask 1020. In this case the photoresist layer 904 is further patterned corresponding to the openings 903 and 905. The opening 903 may be considered to include a resist portion 1002, and an oxide portion 1004. Likewise, the openings 905 include a resist portion 1006 and an oxide portion 1008. As noted previously, the photoresist thickness around opening 903 is thicker than the photoresist thickness surrounding the plurality of openings 905.

The mask 1020 includes a substrate 1024 which may be a glass material and an attenuator 1012 that includes openings 1030 and 1050. According to an embodiment of the present invention, the feature sizes of the openings 1030 and 1050 are determined utilizing a model correlating the resist thickness and the desired feature size dimensions. In the illustrated embodiment, the feature size for the opening 1030 is greater than the feature sizes of the openings 1050. In other words, the photoresist thickness generally tends to be much thicker surrounding the isolated areas as opposed to the photoresist thickness in the dense areas. However, the resist portion 1002 of opening 903 and the resist portions 1006 of openings 905 have a substantially similar width even though the trench density for openings 905 is greater than the trench density for opening 903. Utilizing an embodiment of the present invention, the feature size of the openings 1030 and 1050 can be predicted knowing the resist thickness surrounding the openings 903 and 905.

Figure 11:
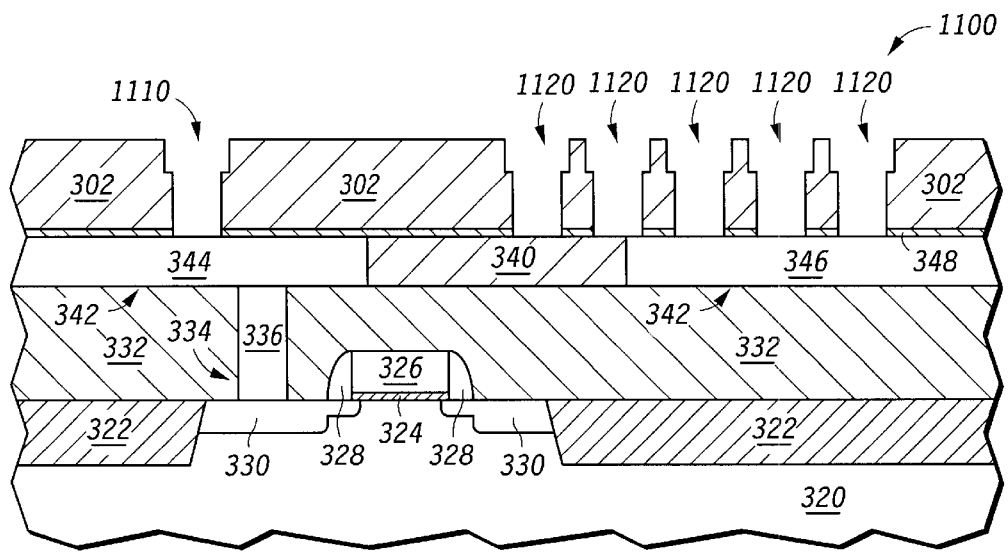
FIG. 11 illustrates a cross-sectional view of an exemplary semiconductor device substrate according to an embodiment of the present invention wherein trenches have been formed.

FIG. 11 illustrates a cross-sectional view of an exemplary semiconductor device substrate 1100 according to an embodiment of the present invention. The semiconductor device substrate 1100 includes the semiconductor device substrate 901 with modifications and additions. The semiconductor device substrate 1100 now includes trenches defined by the openings in resist layer 904 and formed by etching into ILD layer 302. A timed etch may be used to form these trenches where only a first portion of the openings 903 and 905 are etched. The trenches, in combination with the existing vias, create dual inlaid vias 1110 and 1120. Dual inlaid vias 1110 and 1120 each include a trench portion having substantially the same width, while the trench density of dual inlaid vias 1120 is greater than that of dual inlaid via 1110. Therefore, one of ordinary skill in the art may appreciate how embodiments of the present invention allow for greater uniformity in device features through variations in mask features. As mentioned above, the variations in the mask features can be predicted knowing the variations in the resist thickness.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for forming a semiconductor device comprising:
    forming a patterned first layer over a semiconductor device substrate, wherein:
        the patterned first layer includes a first feature within a first region having a first feature density; and
        the patterned first layer includes a second feature within a second region having a second feature density that is substantially different from the first feature density;

forming a second layer over the patterned first layer; and patterning the second layer using a mask to form a third feature and a fourth feature, wherein;
  the mask includes a fifth feature corresponding to the third feature;
the mask includes a sixth feature corresponding to the fourth feature, wherein the sixth feature has a lateral dimension different than a lateral dimension of the fifth feature;
  a first ratio is a ratio of a lateral dimension of the third feature compared to a lateral dimension of the fourth feature;
  a second ratio is a ratio of a lateral dimension of the fifth feature compared to a lateral dimension of the sixth feature; and
  the first ratio is different compared to the second ratio.

2. The process of claim 1, wherein forming the second layer is performed by coating the second layer over the semiconductor device substrate.

3. The process of claim 1, wherein the second layer is a resist layer.

4. The process of claim 1, wherein the second layer includes a low-k dielectric material.

5. The process of claim 1, wherein the first and second feature densities correspond to trench densities within the first layer.

6. The process of claim 1, wherein a first thickness of the second layer within the first region is at least approximately 10 percent thicker than a second thickness of the second layer within the second region.

7. The process of claim 6, wherein:
  the third feature corresponds to the first feature;
  the fourth feature corresponds to the second feature;
  the third and fourth features are to occupy a substantially same amount of area within the second layer; and
  an area of the fifth feature is larger than an area of the sixth feature.

8. The process of claim 6, wherein:
  the first layer is characterized by a step height; and
  a lesser of the first and second thicknesses is no thicker than approximately twice the step height.

9. The process of claim 1, wherein each of the first and second regions occupies an area of approximately 100 square microns.

10. The process of claim 1, wherein the first ratio is approximately equal to one.

11. A process for forming a semiconductor device comprising:
  providing a substrate including a first feature and a second feature;
  forming a first layer over the substrate, wherein:
    the first layer has an undulating, exposed surface;
    the first layer has a first thickness over the first feature;
    the first layer has a second thickness over the second feature; and
    the second thickness is different from the first thickness; and
  patterning the first layer using a mask to form a third feature and a fourth feature within the first layer, wherein:
    the mask includes a fifth feature corresponding to the third feature;
    the mask includes a sixth feature corresponding to the fourth feature;
    a first ratio is a ratio of a lateral dimension of the third feature compared to a lateral dimension of the fourth feature;
    a second ratio is a ratio of a lateral dimension of the fifth feature compared to a lateral dimension of the sixth feature; and
    the first ratio is substantially different compared to the second ratio.

12. The process of claim 11, wherein forming the first layer is performed by coating the first layer over the substrate.

13. The process of claim 11, wherein the first layer is a resist layer.

14. The process of claim 11, wherein the first layer includes a low-k dielectric material.

15. The process of claim 11, wherein the first thickness is at least approximately 10 percent thicker than the second thickness.

16. The process of claim 11, wherein:
  the third feature lies within a first region having a first feature density;
  the fourth feature lies within a second region have a second feature density; and
  the second feature density is larger than the first feature density.

17. The process of claim 16, further comprising forming a seventh feature and an eighth feature within the substrate, wherein:
  the seventh feature is formed below the third feature;
  the eighth feature is formed below the fourth feature; and
  the seventh feature and the eighth feature occupy substantially a same amount of area.

18. The process of claim 16, wherein the first and second feature densities correspond to trench densities within the first layer.

19. The process of claim 16, wherein each of the first and second regions occupies an area of approximately 100 square microns.

20. The process of claim 11, wherein the first ratio is approximately equal to one.

21. The process of claim 11, wherein the fifth and sixth feature have different lateral dimensions.

* * * * *